United States Patent [19]

Yang et al.

[11] 4,392,928

[45] Jul. 12, 1983

[54] METHOD OF DOPING A SEMICONDUCTOR

[75] Inventors: Chiang Y. Yang, Miller Place, N.Y.; Robert A. Rapp, Columbus, Ohio

[73] Assignee: The United States of America as represented by the United States Department of Energy, Washington, D.C.

[21] Appl. No.: 342,683

[22] Filed: Jan. 26, 1982

[51] Int. Cl.³ ............................................. C25D 5/00
[52] U.S. Cl. ................................................... 204/130
[58] Field of Search ................................ 204/130, 228

[56] References Cited

U.S. PATENT DOCUMENTS 4,032,418 6/1977 Antula ................................ 204/130

Primary Examiner—R. L. Andrews
Attorney, Agent, or Firm—Robert H. Whisker; Paul A. Gottlieb; Richard G. Besha

[57] ABSTRACT

A method for doping semiconductor material. An interface is established between a solid electrolyte and a semiconductor to be doped. The electrolyte is chosen to be an ionic conductor of the selected impurity and the semiconductor material and electrolyte are jointly chosen so that any compound formed from the impurity and the semiconductor will have a free energy no lower than the electrolyte. A potential is then established across the interface so as to allow the impurity ions to diffuse into the semiconductor. In one embodiment the semiconductor and electrolyte may be heated so as to increase the diffusion coefficient.

8 Claims, 1 Drawing Figure

METHOD OF DOPING A SEMICONDUCTOR

BACKGROUND OF THE INVENTION

The invention described herein was made or conceived in the course of, or under a contract with, the U.S. Department of Energy.

This invention relates to a method for doping semiconductors, and more particularly to a method for electrochemically diffusing a selected species of ions into a semiconductor substrate.

The valuable electronic properties of semiconductors are a result of precisely controlled amounts of impurities, or defects, which are introduced into the crystal structure of the semiconductor material. The processes by which these impurities are introduced are generally referred to as semiconductor doping. Numerous techniques for semiconductor doping have been developed as semiconductor technology has grown over the years. Perhaps the most common techniques have involved thermal diffusion of the impurity into the semiconductor. In thermal diffusion methods of doping the impurity is brought into contact with the semiconductor at an elevated temperature. Generally, the impurity is in the gas phase, but it may also be in the liquid phase. Both liquid and gas phase thermal diffusion methods suffer from the disadvantages that it is difficult to control the concentration, as a function of depth, of the impurity in the semiconductor and that relatively large amounts of energy are necessary to vaporize or melt the impurity.

Another method of doping semiconductors is to use accelerators, such as electrostatic accelerators, to generate energetic beams of ions of the desired impurity. These beams are then focussed on the semiconductor so that ions penetrate into the bulk semiconductor. While this method, generally known as ion implantation, does give better control of the concentration, it requires elaborate, expensive equipment and relatively large amounts of energy.

It is also known to electrochemically diffuse impurity ions from a liquid electrolyte, which ionically conducts the chosen impurity, into a semiconductor material. For this method, however, the selection of impurities is limited, and the required low operating temperature limits the diffusion coefficient in the semiconductor, reducing the penetration of the impurity into the semiconductor.

In view of the above description of the known techniques for the doping of semiconductors and the inherent disadvantages of those techniques it is an object of the subject invention to provide a method for doping semiconductors which is capable of providing a high degree of control of the concentration of the impurity with depth.

It is another object of the subject invention to provide a method of semiconductor doping which does not require large amounts of energy to vaporize or melt bulk quantities of the impurity.

It is still another object of the subject invention to provide a method of semiconductor doping which does not require elaborate and expensive equipment such as ion accelerators.

It is also an object of the subject invention to provide a method of semiconductor doping which is capable of use over a broad class of impurities and semiconductors.

It is also an object of the subject invention to provide an electrochemical diffusion process which may be carried out at high temperatures.

BRIEF SUMMARY OF THE INVENTION

The disadvantages of the known methods of semiconductor doping are overcome and the above described objects are achieved by means of a method comprising the steps of bringing a semiconductor to be doped into contact with a solid electrolyte so as to establish an interface between the semiconductor and the electrolyte over the areas of the semiconductor where it is desired to introduce the impurity. The electrolyte is chosen to be an ionic conductor of the selected impurity and the electrolyte and semiconductor are jointly chosen so that any compound formed from the impurity and the semiconductor will have a free energy no lower than that of the electrolyte. A potential is then established across the interface so as to allow the impurity ions to diffuse into the semiconductor.

In a preferred embodiment the method is carried out at an elevated temperature in order to increase the diffusion constant in the semiconductor so as to reduce the time required for the impurity to penetrate into the semiconductor.

In another preferred embodiment current is returned to the electrolyte through an electrode referred to as a "counter-electrode." This electrode is formed from a compound of the impurity which is relatively easily electrochemically disassociated. Thus, the counter-electrode serves as a source of impurity ions, so as to keep the impurity concentration in the electrolyte constant.

Since the diffusion of the impurity is an electrochemical process the concentration as a function of depth may advantageously be controlled with a high degree of precision by varying the potential across the interface, the operating temperature and the processing time.

It is a further advantage of the subject invention that the impurity ions may be incorporated into the solid electrolyte without melting or evaporating the bulk impurity.

It is another advantage of the subject invention that the method may be carried out by means of a relatively simple solid electrolyte cell operating at a relatively low potential.

It is still another advantage of the subject invention that solid electrolytes which conduct suitable impurity ions are available for a large class of impurities.

Further, since the electrolyte of subject invention is a solid the electrochemical cell of the subject invention may advantageously be operated at higher temperatures so as to increase the diffusion constant in the semiconductor.

Thus, the method of the subject invention achieves the objects sought and overcomes the disadvantages described above. Other objects and advantages of the subject invention will become apparent to those skilled in the art from a consideration of the detailed description of the embodiments set forth below.

DETAILED DESCRIPTION

Figure 1:
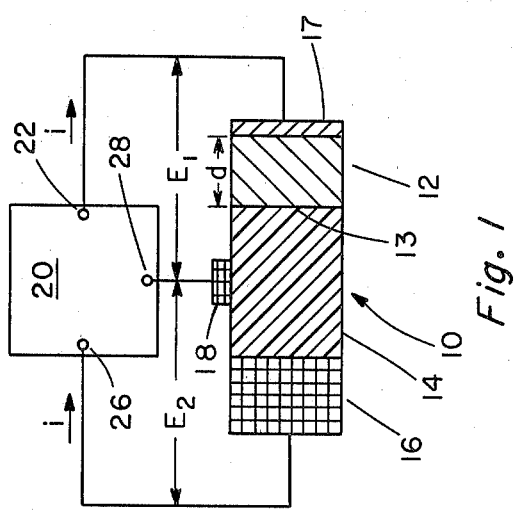
FIG. 1 is a schematic representation of an electrolyte cell used in accordance with the subject invention.

Referring now to FIG. 1 there is shown an electrochemical cell 10 used in the practice of the subject invention. A working electrode 12 formed of the semiconductor to be doped, is maintained so that one surface is in contact with a surface of the solid electrolyte 14 forming interface 13. The working electrode 12 might, for example, be formed of $TiO_2$ and the electrolyte formed of $BaF_2$ if it is desired to dope $TiO_2$ with a fluorine impurity. A current return path to the electrolyte is provided through a counter-electrode 16. For a $TiO_2$ working electrode 12 and a $BaF_2$ electrolyte 14 counter-electrode 16 may be formed of a $Co$-$CoF_2$ mixture. A third, reference, electrode 18, also formed of a $Co$-$CoF_2$ mixture, is also placed in contact with electrolyte 14. Working electrode 12, counter-electrode 16 and reference electrode 18 are connected to terminals 22, 26 and 28 respectively of potentiostat 20. Potentiostat 20 serves to maintain potential $E_1$ constant between reference electrode 18 and working electrode 12, while potential $E_2$ varies with the current flowing in cell 10. (Potentiostats are commercially available devices for maintaining constant potentials and are well known to those skilled in the art. No further description of their operation is believed necessary to an understanding of the subject invention.)

Preferably, the surface of working electrode 12 opposite interface 13 will be covered with metal contact 17, typically platinum, to provide good electrical contact and to maintain a uniform electrical field in the volume of working electrode 12. Contact 17 is preferably platinum since platinum is essentially impervious to most impurity ions, so blocking the impurity ions within working electrode 12.

In operation potential $E_1$ is chosen to allow impurity ions, for example fluorine ions, to diffuse into the bulk of working electrode 12.

It may be shown that the electrochemical doping process of the subject invention is a diffusion process described by the partial differential equation:

$$\frac{\partial C}{\partial t} = D \left( \frac{\partial^2 C}{\partial x^2} \right).$$

For the boundary conditions:

$$C = C(E_{o.c.}) \text{ for } 0 \leq x \leq d, t = 0$$
$$C = C(E_1) \text{ for } x = 0, t > 0$$

$$\frac{\partial C}{\partial x} = 0 \text{ for } x = d$$

(where C is the impurity concentration expressed as an atomic fraction):
which corresponds to applying potential $E_1$ in the cell 10 of FIG. 1 at time $t=0$, it can be shown that the concentration profile is given by:

$$C(x,t) = C(E_1) - (C(E_1) - C(E_{o.c.})) \sum_{n=1}^{\infty} F(n,x) G(n,t)$$

where:

$$F(n,x) = \frac{4 \sin((2n-1)\pi x)}{2d(2n-1)}$$

$$G(n,t) = \exp\left( -\left(\frac{2n-1}{2d}\right)^2 D(T)\pi^2 t \right)$$

and the following definitions apply:
$C(x,t)$: impurity concentration distribution $C(E_{o.c.})$: initial uniform impurity concentration, a function of $E_{o.c.}$.
$C(E_1)$: steady state uniform impurity concentration with $E_1$ applied
$D(T)$: diffusion coefficient, a function of T
V: molar volume of the working electrode 12
T: temperature of cell 10
$E_1$: potential between reference electrode 18 and working electrode 12
$E_{o.c.}$: $E_1$ measured under open circuit conditions
$E_2$: potential between reference electrode 18 and counter electrode 16
x: distance from interface 13 to a point within electrode 12, $0 \leq x \leq d$; where d is the width of working electrode 12.
t: duration of time potential $E_1$ is applied.

From this it can be seen that the variables which control the diffusion process are $C(E_1)$ (and thus $E_1$) $D(T)$ (and thus T) and t. However, the functions $C(E_1)$ and $D(T)$ are, in general, not known, and particular values may need to be determined for particular combinations of working electrode, electrolyte, $E_1$ and T.

In accordance with the subject invention these values are determined by constructing the cell of FIG. 1, using the working electrode and electrolyte of interest. The cell is heated until it is in equilibrium at the temperature, T, of interest and the potential, $E_1$ of interest is applied and the current, i, flowing in the cell is measured periodically so that the function i(t) may be determined. After a period of time i(t) will be observed to reach an essentially constant value. Since it can be shown that:

$$i(t) = i_{ion}(t) + i_e$$

where
$i_{ion}(t)$: impurity ion current
$i_e$: electron current, a constant
it follows that the constant value observed is $i_e$ and $i_{ion}(t)$ may be determined by subtracting $i_e$ from i(t).

Solving the partial differential equation given above for current we get:

$$i_{ion}(t) = B \sum_{n=1}^{\infty} \exp\left( -\left(\frac{2n-1}{2d}\right)^2 \pi^2 D(T)t \right)$$

where:
$B = 8FAD(T)/(C(E_1) - C(E_{o.c.})) Vd$, with
F: Faraday constant
A: area of interface 13.

For t sufficiently large this expression is dominated by the first term and we get:

$$i_{ion}(t) \simeq B \exp\left( -\frac{\pi^2 D(T)t}{4d^2} \right)$$

Thus, for t sufficiently large the function ln ($i_{ion}(t)$) is essentially linear and the value D(T) may be determined from the slope of this linear region. $C(E_1)$ may be determined by extrapolating the linear region to find the $t=0$ intercept, which is approximately equal to B. From B, D(T) and $C(E_{o.c.})$, $C(E_1)$ may be determined.

Having determined $C(E_1)$ and D(T) for the conditions of interest, t may be selected to achieve the desired distribution in accordance with the expression:

$$C(x,t) = C(E_1) - (C(E_1) - C(E_{o.c.})) \sum_{n=1}^{\infty} F(n,x)G(n,t)$$

It is also within the contemplation of the subject invention to vary either $E_1$ or T or other parameters after a preselected amount of time t has elapsed in order to achieve greater flexibility in the distribution, $C(x,t)$, than that which may be realized otherwise. However, when such changes are made further doping will no longer give impurity concentrations in accordance with the above expression for $C(x,t)$ since the initial boundary conditions would no longer hold. In order to determne $C(x,t)$ when T or $E_1$ is changed it is necessary to determine the new boundary conditions and solve the partial differential equation:

$$\frac{\partial C}{\partial t} = D\left(\frac{\partial^2 C}{\partial x^2}\right)$$

numerically, by any of numerous well known techniques for the numerical solution of partial differential equations.

In the practice of the subject invention, it is important to note that the interface 13 need not cover the full extent of the working electrode area but may be masked so that the working electrode is doped only in preselected regions.

It is also important to note that where the working electrode is formed from a high purity crystalline semiconductor it is important to avoid mechanical stresses in the assembly of the cell of FIG. 1, since such stresses may introduce stress defects into the crystalline structure. Further, the process should be carried out in a purified inert atmosphere or other precaution taken, in order to avoid contamination of the semiconductor.

EXPERIMENTAL EXAMPLE I

A cell substantially as shown in FIG. 1 was constructed in order to uniformly dope a $TiO_2$ sample with a fluorine impurity and to establish particular values for $D(T)$ and $C(E_1)$. Working electrode 12 was $TiO_2$, electrolyte 14 was $BaF_2$ and counter-electrode 16 and reference electrode 18 were formed from a $Co-CoF_2$ mixture. Contact 17 was platinum. $E_{o.c.}$ was measured as approximately $-400$ mV corresponding to $C(E_{o.c.})$ (i.e. a negligible initial fluorine concentration in working electrode 12) $A \cong 0.7$ cm$^2$ and $d \cong 0.3$ cm.

The cell was heated in a purified inert gas environment within a tubular furnace to a uniform temperature of 800° C. in a period of two hours and a potential, $E_1 \cong -200$ mV was applied between working electrode 12 and reference electrode 18. The current i was recorded and a plot of i vs. t was obtained. After several hours i was observed to reach a steady state value, $i_e$, and the function:

$$i_{ion}(t) = i(t) - i_e$$

was then plotted on semi-logarithmic paper and was observed to be essentially linear for t > 20 sec. $D(800°$ C.) was determined from the slope of this linear region and found to be approximately $9.98 \times 10^{-6}$ cm$^2$/sec. The linear region was extrapolated back to $t = 0$ to find $C(E_1)$ which was determined to be approximately $4 \times 10^{-3}$ atomic percent.

This example shows the method of the subject invention used to uniformly dope a $TiO_2$ sample with fluorine impurities and also to determine particular values of $C(E_1)$ and $D(T)$.

EXPERIMENTAL EXAMPLE II

A cell substantially as described in Experimental Example I was constructed, working electrode 12 having a negligible concentration of fluorine impurities. The cell was heated to a uniform temperature of 400° C. and a potential of 0 mV was applied for 40 sec. The ionic current was determined and found to have an average value of approximately $10^{-7}$ amps; approximately equivalent to an ionic charge of $4 \times 10^{-6}$ Coulombs. $D(400°$ C.) was determined to be approximately $10^{-9}$ cm$^2$/sec.

For values of $D(T)$ sufficiently low it may be shown that the impurity distribution may be approximated by a uniform distribution over a penetration depth, 1, where:

$$1 = \sqrt{D(T)t} = \sqrt{10^{-9} \times 40} = 2 \times 10^{-4} \text{ cm.}$$

From the ionic charge it was determined that the impurity concentration, over the depth was approximately $6 \times 10^{-6}$ atomic percent.

The $TiO_2$ sample was then used in place of an undoped $TiO_2$ electrode in a photochemical water electrolysis cell substantially similar to that described in: A. Fujishima and K. Honda; "Electrochemical Photolysis of Water at a Semiconductor Electrode, " *Nature* Vol. 238, pg. 37 (July '72). Improved performance was observed for the doped $TiO_2$ electrode.

This example shows the method of the subject invention used to form an impurity concentration substantially at the surface of the sample.

The above descriptions and examples are set forth by way of illustration only and numerous embodiments of the subject invention will be apparent to those skilled in the art. Limitations on the scope of the subject invention are thus to be found only in the claims set forth below.

We claim:

1. A method for doping semiconductor material with a chosen impurity comprising the steps of:
   (a) establishing an interface between a solid semiconductor and a solid electrolyte, forming a semiconductor/electrolyte cell, said solid electrolyte being an ionic conductor of said impurity and said semiconductor and said electrolyte being jointly chosen so that any compound formed from said semiconductor and said impurity will have a free energy of formation no lower than the free energy of formation of said electrolyte; and,
   (b) establishing a potential across said interface, said potential being chosen so as to allow diffusion of impurity ions from said electrolyte into said semiconductor.

2. The method of claim 1, wherein said semiconductor/electrolyte cell is heated to a temperature sufficient to substantially increase the diffusivity of said impurity in said semiconductor material.

3. The method of claim 2 wherein a counter-electrode is connected to said solid electrolyte to provide a return path for current and to maintain a substantially constant impurity ion concentration in said electrolyte.

4. The method of claim 3, wherein a third, reference, electrode is connected to said electrolyte between said working electrode and said counter-electrode and a potentiostat is connected to said electrodes to maintain said potential constant.

5. The method of claim 4, wherein electrical contact is made to said semiconductor through an extended metal contact, said contact extending over a surface of said semiconductor, said surface being spaced from, essentially parallel to and essentially congruent with said interface, and said contact being formed from a metal substantially impervious to said impurity.

6. The method of claims 1, 2, 3, 4 or 5, wherein said semiconductor material is in the form of a sample having known values for the parameters A, V and d, said method comprising the additional steps of:
   (a) first establishing values for $C(E_{o.c.})$, $D(T)$ and $C(E_1)$ for selected values of T and E;
   (b) after step (a) of claim 1 heating said cell to said selected value of T;
   (c) establishing the selected value of $E_1$ as the potential step (b) of claim 1; and
   (d) continuing to apply said potential for a selected time t, whereby a selected concentration distribution, $C(x,t)$ is established, $C(x,t)$ being approximately determined by the relationship:

$$C(x,t) = C(E_1) - (C(E_1) - C(E_{o.c.})) \sum_{n=1}^{\infty} F(n,x)G(n,t)$$

7. The method of claims 1, 2, 3, 4 or 5, wherein said semiconductor has previously been doped.

8. The method of claim 6, wherein after a said selected time one of the parameters E, or T is changed and the doping is continued for a further period.

* * * * *